United States Patent [19]

Gentile

[11] Patent Number: 5,544,290
[45] Date of Patent: Aug. 6, 1996

[54] METHOD AND APPARATUS FOR PROCESSING DATA FOR A VISUAL-OUTPUT DEVICE WITH REDUCED BUFFER MEMORY REQUIREMENTS

[75] Inventor: Ronald S. Gentile, Atherton, Calif.

[73] Assignee: Adobe Systems, Inc., Mountain View, Calif.

[21] Appl. No.: 470,737

[22] Filed: Jun. 6, 1995

Related U.S. Application Data

[62] Division of Ser. No. 974,204, Nov. 10, 1992.

[51] Int. Cl.$^6$ .................................................. G06K 15/00
[52] U.S. Cl. ........................................... 395/115; 395/114
[58] Field of Search ..................................... 395/115, 110, 395/114, 116, 108, 111, 109; 358/296

[56] References Cited

U.S. PATENT DOCUMENTS

| | | | |
|---|---|---|---|
| 5,034,804 | 7/1991 | Sasaki et al. | 358/296 |
| 5,150,454 | 9/1992 | Wood et al. | 395/119 |
| 5,199,803 | 4/1993 | Shimizu et al. . | |
| 5,207,517 | 5/1993 | Ito | 400/121 |
| 5,208,676 | 5/1993 | Inui | 358/296 |
| 5,241,397 | 8/1993 | Yamada | 358/296 |
| 5,270,728 | 12/1993 | Lund et al. . | |
| 5,272,768 | 12/1993 | Bauman et al. | 395/110 |
| 5,276,780 | 1/1994 | Sugiura | 395/116 |
| 5,295,233 | 3/1994 | Ota | 395/115 |
| 5,299,292 | 3/1994 | Kadowaki et al. . | |
| 5,347,368 | 9/1994 | Machizuki | 358/296 |
| 5,354,135 | 10/1994 | Sakagami et al. . | |
| 5,355,441 | 10/1994 | Kawai et al. | 395/115 |
| 5,374,943 | 12/1994 | Lehmann et al. . | |
| 5,377,312 | 12/1994 | Kobayashi . | |

FOREIGN PATENT DOCUMENTS

| | | |
|---|---|---|
| 320014A2 | 6/1989 | European Pat. Off. . |
| 0475601A3 | 3/1992 | European Pat. Off. . |

OTHER PUBLICATIONS

Fred Mintzer "Integrating Image Into Computers for Publishing" IEEE/IEICE Global Telecommunications Conf. 1987, Nov. 15, 1987, Japan pp. 740–743,XP12797.

Okada et al., "Adaptive Coding for Text and Dithered Continuous-Tone Images", Fujitsu Scientific & Technical Journal, vol. 23, No. 2, 1987, Japan, pp. 101–110.

*Primary Examiner*—Raymond J. Bayerl
*Assistant Examiner*—Steven P. Sax
*Attorney, Agent, or Firm*—Edward B. Anderson

[57] ABSTRACT

A two-dimensional page representation to be printed has a combination of text, graphic and image representation types. A data memory stores data representative of the page representation. A program memory stores program instructions including a plurality of different algorithms for compressing data associated with corresponding different representation types and their combinations. A processor is coupled to the data and program memories for (a) identifying separate data for each of a plurality of regions containing collectively the page representation, with the data for each region corresponding to the portion of the page representation contained in that region; (b) determining the types of representations and boundaries of each type of representation and the combinations of types contained in each region; (c) rasterizing and compressing the data associated with the determined types of representations for each region with algorithms based on selected compression factors; (d) storing sequentially the compressed data for each region; and (e) when needed for printing, sequentially for each region, reading the corresponding stored data, decompressing the read data, and transmitting the decompressed data to the print device for printing.

11 Claims, 8 Drawing Sheets

METHOD AND APPARATUS FOR PROCESSING DATA FOR A VISUAL-OUTPUT DEVICE WITH REDUCED BUFFER MEMORY REQUIREMENTS

This is a division of copending application Ser. No. 07/974,204, filed on Nov. 10, 1992.

BACKGROUND OF THE INVENTION

1. Field of the Invention

This invention relates to a method and apparatus for processing data representative of a visual representation, typically including a combination of text, graphics, and images, that is to be output to a visual-output device, such as a screen display or print device. More particularly it relates to such a method and apparatus in which a data memory, referred to herein functionally as a "buffer memory", has reduced capacity requirements resulting from the selective compression of data.

2. Related Art

The preferred embodiment of, and preferred method of practicing the present invention is directed to printers that form a raster image typically connected indirectly over a network, or directly to a computer for printing documents created on the computer. The invention is realizable for other forms of output devices as well, such as a video display generated on a CRT monitor or an LCD. Thus, the device creating the actual visual representation is referred to as a "visual-output device". The visual area within which the visual representation exists is referred to as a "page", regardless of its actual form. The complete visual representation is referred to as a "page representation". A separately defined part of a page representation is referred to as an "object".

One of the significant cost elements in a conventional printer is a buffer memory, also referred to as a frame buffer, for storing raster data defining the page representation. Conventional printer configurations employ buffer memories that are capable of storing all of the raster data required to define each pixel on a page. An extensive amount of memory capacity is therefore typically required. A black-and-white representation for a 8.5 inch×11 inch sheet of paper at a pixel density of 300 dpi (dots or pixels per inch) requires in excess of 1 MByte (1 million 8-bit bytes) of memory. Higher spatial and tonal resolutions, color printing and larger paper sizes require even more memory. A continuous tone, four-color representation at a pixel density of 600 dpi for the same sized page requires about 135 MBytes of memory. Since the printer costs rise with memory size, it is desirable to provide printers with reduced memory requirements.

A memory device known by the proprietary name of "Memory Miser" produced by Advanced Micro Devices of Santa Clara, Calif., stores data in a resident memory by applying a compression algorithm to all of the data input. When required for output it is decompressed based on the reverse of the compression algorithm and output. If used in a printer, such a device would reduce the amount of memory required. However, the memory would need to be at least large enough to store the most complex page representation in order to be able to process any page that is input. This printer would have little flexibility in processing the variety of page representations possible with present day printers.

SUMMARY OF THE INVENTION

The present invention provides a method for using, and an apparatus permitting a reduced-size memory. Further, it provides a method and apparatus that can accommodate a variety of page representation characteristics and data processing objectives.

The invention is directed generally to an apparatus and a method for processing data representative of a page representation for output to a visual-output device, such as the electro-mechanical printing apparatus (also referred to as the print device), of a printer. The method begins with the step of receiving data that defines a page representation. A plurality of regions of the page are selected, which regions contain at least a portion of the page representation. In one aspect of the invention, separate data for each such region is identified corresponding to the portion of the page representation contained in that region. Data identified for at least one of the regions is then compressed, using at least one compression algorithm and stored. For producing the page representation after storing the compressed data, the compressed data is decompressed and transmitted to the visual-output device.

In another aspect of the invention, at least one compression factor and a plurality of compression algorithms are provided. The compression factor has a determinable value that is related to a reference value. A compression algorithm is then chosen based on the relationship of the determined value of the compression factor to the reference value.

More specifically, the preferred embodiment of the invention is an apparatus for printing a two-dimensional page representation composed potentially of text, graphic and image objects (object representations) individually, and in combination. A print device is responsive to raster data for printing a page containing the page representation. An input device, such as a personal computer or workstation, is used for inputting data defining the page representation. A program memory stores program instructions including a plurality of different algorithms for compressing the data associated with corresponding different representation types and their combinations. The selection of compression algorithms is based in part on balancing the compression factors of compression ratio, computational complexity, and visual quality. A processor is coupled to the input device, print device, program memory and a data memory for executing the stored program instructions.

The processor is responsive to the data input in the form of descriptive commands for identifying data for each of a plurality of ordered regions or bands containing collectively at least a portion, and preferably, all of the page representation. The data for each region corresponds to the portion of the page representation contained in that region. Some regions may not contain data. The descriptive commands, which are not necessarily band limited, are converted into lists of primitive elements selected from a set of primitive elements. Each primitive element represents at least a portion of an object representation. These lists are referred to as display lists. There is preferably a display list for each region, although the display list could be for the entire page, or for other defined regions.

The types (and combinations of types) of representations and boundaries (referred to as bounding boxes) of each type contained in each region are determined. The display list data associated with the determined types of representations for each region is rasterized into an uncompressed band and then compressed using algorithms corresponding to the analysis of certain compression factors. Rasterizing refers generally to the conversion of high-level descriptive commands into rasters. Data associated with primitive elements is often already in raster form. However, for purposes of this discussion, rasterizing refers to the conversion of display list data for a region into raster form without regard for whether or not the data associated with the corresponding primitive elements is already in raster form.

The compression factors may, and preferably do include compression goals specifying target visual quality, compression ratio, and computational complexity. Compression ratio refers generally to the bytes of memory required to hold the compressed data relative to the bytes of memory required to hold the same data uncompressed. Additionally considered are such factors as the type of representation, content of individual bounding boxes, overall content of the page representation, estimated versus actual compression being achieved, and the number of passes or attempts made at compressing the data. Other factors may also be used, and some of these factors may not be used in all situations. For example, the factors could be prioritized so that some are given more weight than others. As an extension of this, in certain situations some factors could be given no weight at all relative to other factors.

Some of these factors inherently have values that are readily determined. Others relate to characteristics or features the state of which is determined and a value assigned accordingly. For instance, the three representation types of text, graphics and images could be assigned arbitrary respective identifier values 1, 2, and 3.

An algorithm, generally speaking, refers to a particular algorithm or combination of algorithms with particular parameter values. Thus, a change in parameter values results in a change in the algorithm.

The compressed data is stored sequentially by region. In the preferred embodiment, when required for printing, data for a region is read and decompressed. Depending on the system configuration, the compressed data may be transmitted to an external printer or stored pending requirement of the data by the print device. The data is then transmitted to the print device for printing. Producing data (display lists) for each region and defining the regions to conform to the sequential output of raster data to an output device minimizes the number of times the data is decompressed, data added, and then recompressed. During this overall process "data" defining the page representation takes the form of descriptive commands, display lists and associated information, and raster data.

Data representative of the page representation is thus compressed and held in memory until such time as it is required by the print device for printing, or until the content of a region is changed. The data for the regions are swapped in and out of the compressed-data memory using the selected compression and corresponding decompression algorithms, thereby reducing substantially the buffer memory requirements. This and other features and advantages of the present invention will be apparent from the following detailed description of the preferred embodiment of the invention and as illustrated in the accompanying drawings.

DETAILED DESCRIPTION OF THE PREFERRED EMBODIMENT AND METHOD

Figure 1:
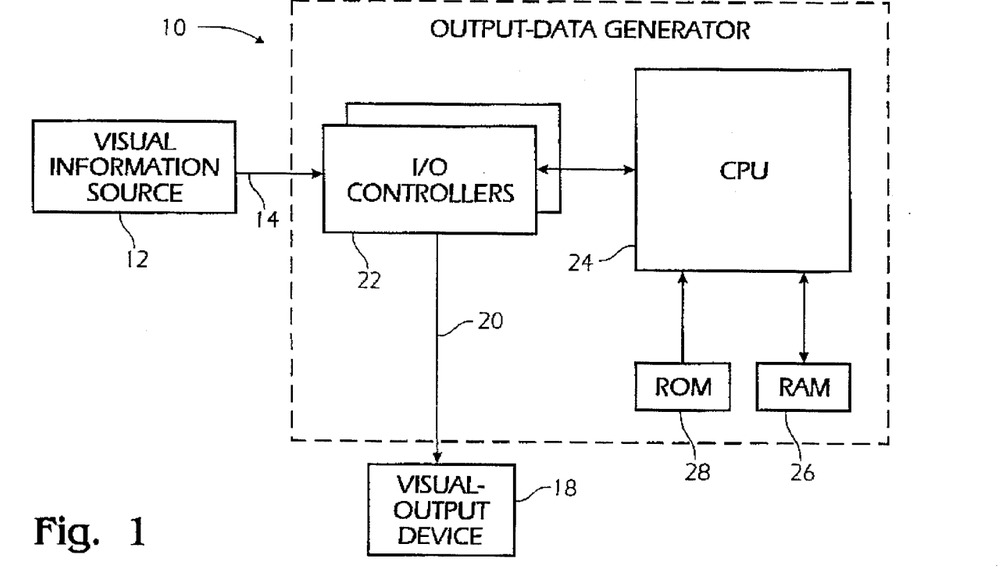
FIG. 1 is a block diagram of an apparatus made according to and for practicing the method of the invention.

Referring initially to FIG. 1, a generalized visual-representation-generating system made according to the present invention is shown generally at 10. It includes a visual information source 12 connected via a communication link 14 to an output-data generator 16. Generator 16 is connected to a visual-output device 18 via a communication link 20. As will be seen, various embodiments are realizable from this general structure. Output data generator 16 can be resident within a host unit including source 12, can be resident within an output unit including visual-output device 18, or can be functionally split between a host unit and an output unit.

In the typical instance when data generator 16 and output device 18 comprise a laser or other raster printer, information source 12 is a conventional work station or other computer-based system, such as an Apple Macintosh or IBM PC. The term print device is also used herein as an example of a visual-output device. In the preferred embodiment, this term applies to the electro-mechanical apparatus responsive to raster data for producing a printed page. Generator 16 could also be incorporated in a computer or workstation, such as a computer-based system as has just been mentioned, programmed to function as described herein, for controlling a raster display or printing device, as has also been mentioned. Further, as is discussed with reference to FIG. 10, a host unit could generate and output the compressed data and an output unit could receive the compressed data, decompress it and transmit it to a resident visual-output device.

The preferred embodiment of the invention is thus directed to the printing of two-dimensional pixel representations. The general concepts are equally applicable to three (or more) dimensional representations to the extent they are realizable in the system of FIG. 1.

Generator 16 includes an input/output controller 22 coupled to communication links 14 and 20. A conventional CPU (central processing unit) or processor 24 is coupled to controller 22, as well as to a read/write or random access memory (RAM) 26, used partially as a buffer memory, for storing data, and a read only memory (ROM) 28 for storing program instructions and fixed information, such as nonvariable data and compression and decompression algorithms, as is discussed in further detail with reference to FIGS. 3, 5, and 7–10. Any of a variety of conventional CPU's may be used, depending on the actual application. Further, other forms of hardware that accomplish the same functions can be used.

Figure 2:
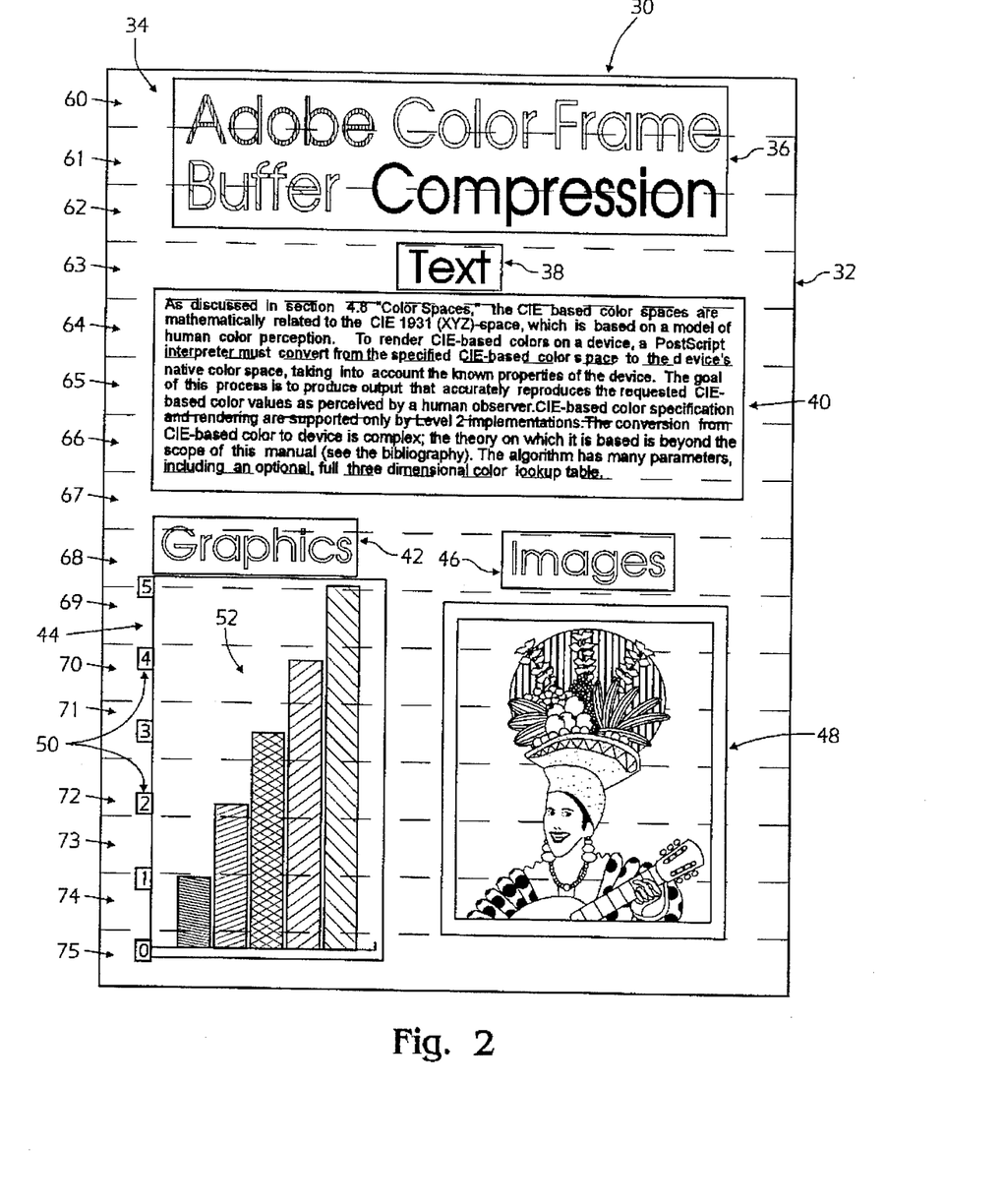
FIG. 2 is an illustration of a page having different types of two-dimensional representations.

FIG. 2 illustrates a page 30 having a page representation 34 that could be defined by data input by the input device using a conventional page-description language, such as the language available from Adobe Systems Incorporated known by the name PostScript. In the printer environment, as a PostScript file is created on source 12 (FIG. 1), objects can be created in any arbitrary order or fashion on a page. The objects are defined by one or more descriptive commands. As used herein, then, an "object-defining command" is the command or collection of commands that define an object.

Different compression schemes have been found to be preferable for the different representation types of text, graphics, and images. For instance, the human eye is often less sensitive to changes in images than to degradations in something as well defined as text. Thus, technically lossy compression schemes such as JPEG, when used at reduced levels of compression for images, can be visually lossless. Further, by the nature of graphics objects, some otherwise lossy schemes may be usable without compromising spatial resolution. The LZW technique has been found to work well on text, runlength coding is effective for graphics and text/graphics combinations, and the JPEG technique is useful for images. It is therefore advantageous to identify the different types of objects in a page representation.

Continuing to refer to FIG. 2, page 30 has defined boundaries represented by border line 32. The boundaries thus represent the maximum area within which page representation 34 is to be produced. Page representation 34 includes the following objects on a background of a single color. A title or main heading 36 is formed of text in different colors (represented by the different tones). A subheading 38 identifies a text representation 40; a subheading 42 identifies a graphics representation 44; and a subheading 46 identifies an image representation 48. These subheadings are text representations in relatively large fonts and, along with text representation 40, are all a single color different than the background color. Text representation 40 is in a reduced font. Graphics representation 44 has grid identifiers 50 in the form of alphanumeric characters (text), and a bar chart section 52 composed of bars of different colors. Image representation 48 is simply an array of pixels of varying colors.

Page representation 34 incorporates separate examples of large and small text, graphics, and image representations or objects. In a more complex page representation various of the different objects could overlap. That is, they could be printed at least partially on a common area. The preferred method of the present invention is designed to take such overlapping areas into consideration, as is discussed in greater detail below.

Figure 3:
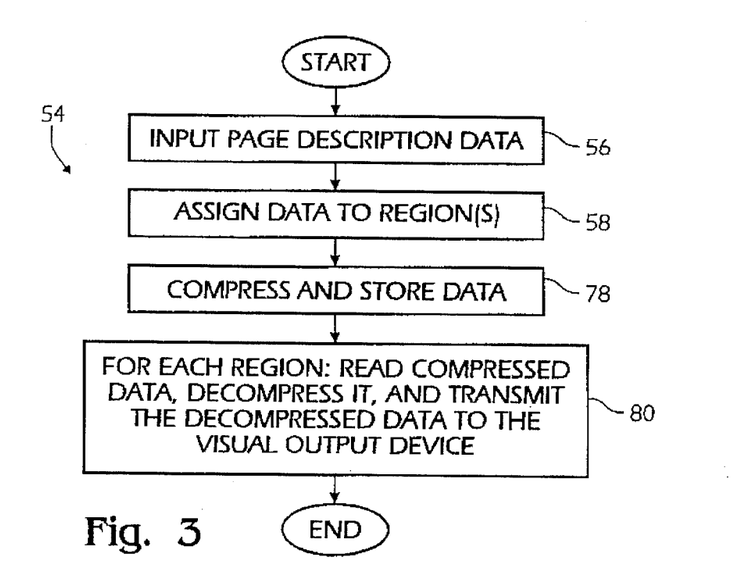
FIG. 3 is a flow diagram summarizing a method of practicing the invention.

A generalized flow diagram chart of a process or method 54 according to the invention is provided in FIG. 3. Processor 24 of FIG. 1 executes instructions to function as an interpreter that recognizes the PostScript descriptive commands input as page data from source 12, as is provided by step 56 in the flow diagram of FIG. 3. In the general method of the invention, the page description data is divided into at least one, and preferably R different data regions at step 58. The regions can be determined in advance, as is the case with the preferred embodiment and therefore be determined arbitrarily with reference to a particular page representation. They could also be determined dynamically for each page representation. Referring to FIG. 2, an example of a dynamic determination would be to divide the page into separate regions corresponding to title heading 36, text subheading 38, text section 40, graphics subheading 42, each of grid identifiers 50, bar chart section 52, image subheading 46 and image section 48. In the preferred embodiment of the invention, however, in which raster data is produced for printing a page, the page area is divided into a plurality of fixed regions in the form of parallel bands. The bands are chosen and ordered to correspond to the generation of raster data for output to a print device, and is therefore related to the resolution and scan order of the output device.

Referring again to FIG. 2, page 30 is shown for purposes of illustration divided into sixteen bands 60–75. When it is time to print, data for band 60 is read out and decompressed first and the data progresses sequentially through the bands until data for the last band 75 is output. These bands each correspond to multiple raster "scans" of the page and provide for ordering the data in a way that will make the data readily available for printing. An actual letter-size page having a resolution of 300 dpi may be divided into about 20 to 40 bands.

As has been mentioned, the present invention provides for a reduction in the amount of memory required through the use of compression techniques, as is represented by step 78 in FIG. 3. By compressing a rasterized version of the descriptive data of the page representation, according to the preferred embodiment, and decompressing it as needed by the printer or display, the amount of RAM needed may be drastically reduced.

This memory reduction is achieved by storing in the working RAM a compressed representation of what is conventionally stored uncompressed in a frame buffer. Raster data is created for one region at a time and stored uncompressed in RAM 26. This data is then compressed and re-stored in RAM 26 until needed. The data for all the regions is ultimately processed in this way until data for essentially all the regions is compressed and stored. In the preferred embodiment of the present invention, as data for each region is requested for output (printing), it is decompressed and output to the output device (print device), as represented by step 80 in FIG. 3.

By compressing the data for the regions in the reverse order required for output to the output device, the compression/decompression cycle of the last region may be avoided, since it can simply be rasterized and output directly. Also, depending on the circumstances, the decompression algorithm typically is, but may not be exactly the reverse of the compression algorithm. When the output (page printing) is completed, process 54 ends for that page.

The following description of this process is directed to processing data for a single page. It will be understood that multiple pages may also be processed at a time using a similar system, so that different ones of the steps take place simultaneously for various regions of the same or different pages.

Figure 4:
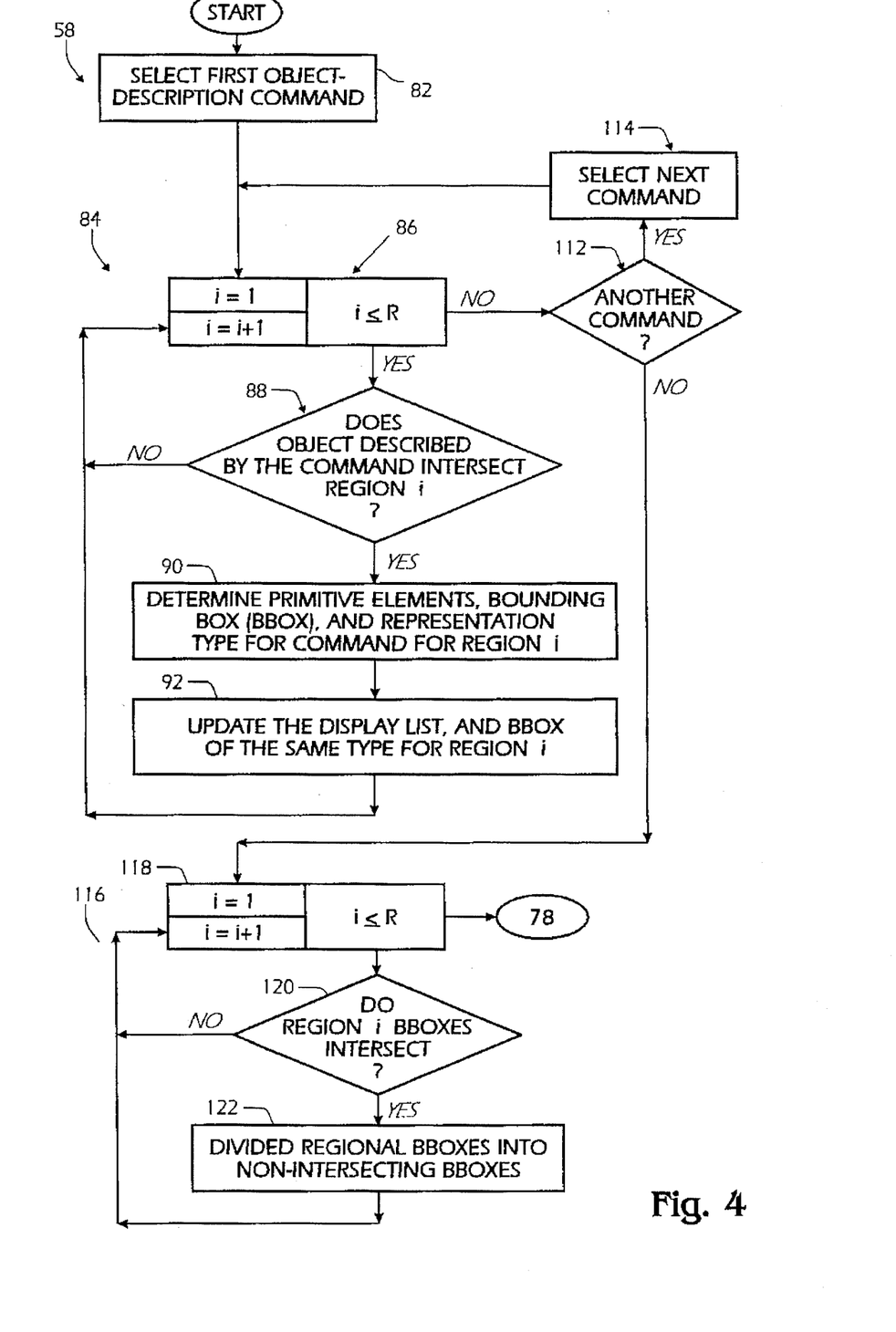
FIG. 4 is a flow diagram of step 58 of the diagram of FIG. 3.

Step 58 is shown in further detail by the flow diagram of FIG. 4. High level descriptive (such as PostScript) commands are input into data generator 16 from a source 12 as shown in FIG. 1. As has been described, these commands define, usually in no particular order, where text, graphics, and image objects appear. Some of the commands do not define a particular object. These commands may be directed to identifying locations on a page, what color to use, and the like. Text typically includes definitions of font and character size, as well as character identifiers and other information, such as the color of the text. Graphics are defined by area fills and strokes of arbitrary color, and images are usually provided by bit or byte patterns.

Referring again to FIG. 4, the first object-defining command is selected at step 82. The intersection of the object defined by the command with each of the R regions (bands) is then determined, as shown generally at 84. Iterative loop step 86 symbolizes the sequential determinations made for each region. When the first region is selected, a determination is made at 88 as to whether the object described by the command intersects the region. If there is no intersection, the next region is selected at step 86 and the determination repeated for that region.

If there is an intersection, primitive elements, collectively referred to as a display list, are generated for the portion of the object in the region at step 90. Primitive elements are basic object portions or "building blocks" that, when combined, form a new definition of an object. Character masks are used to define text. Geometric shapes, such as trapezoids and run arrays (bit patterns) are both graphics primitive elements. Because of the random color and intensity changes, images are defined by the actual image descriptions. In some instances, these primitive elements are stored in the display list indirectly via pointers. Preferably, a single display list is generated for each region. As has been mentioned, it would also be possible to have a single display list for a page with allocation of data to a region taking place as raster data for the region is stored prior to compressing.

Each high level input object-defining command implicitly has a corresponding representation type, such as text, graphics or image. Other ways of classifying the object-defining commands may also be used. In this embodiment, the primitive element has an associated representation type corresponding to this implicit type. A bounding box is also determined for each region in which a portion of an object exists. A representation type is assigned to each bounding box based on the associated primitive element type. In the preferred embodiment, the representation type is one of the three preferred types of text, graphics and image.

A bounding box is a defined area containing an object or object portion in the region. In an X–Y coordinate system, a bounding box is preferably a rectangle defined by the coordinates of the lower left and upper right corners. Other definitions for bounding boxes, such as trapezoids, could also be used. There is thus potentially a single bounding box for each representation type in each region, referred to as a regional bounding box. As is discussed below, as an object is added to a region, the regional bounding box of the same type is preferably expanded to include the area of the new primitive element(s) and the display list for the region is updated, as represented by step 92.

Collecting only one text, one graphic and one image bounding box for each region satisfies a requirement of computational simplicity while processing the primitive elements. However, it does so at the expense of lost local information. For example, if an "a" is marked on the left side of the region and a "b" is marked on the right side of the region, there would be a text bounding box that spans the width of the region although characters do not fill this entire span. Consequently, a logical extension of this invention would be to perform this information collection on a smaller region basis, such as having two or three regions across the width of a page. This would provide more local tracking of the objects in the regions. In general, as has been discussed, the page can be divided into any arbitrary regions.

Figure 5:
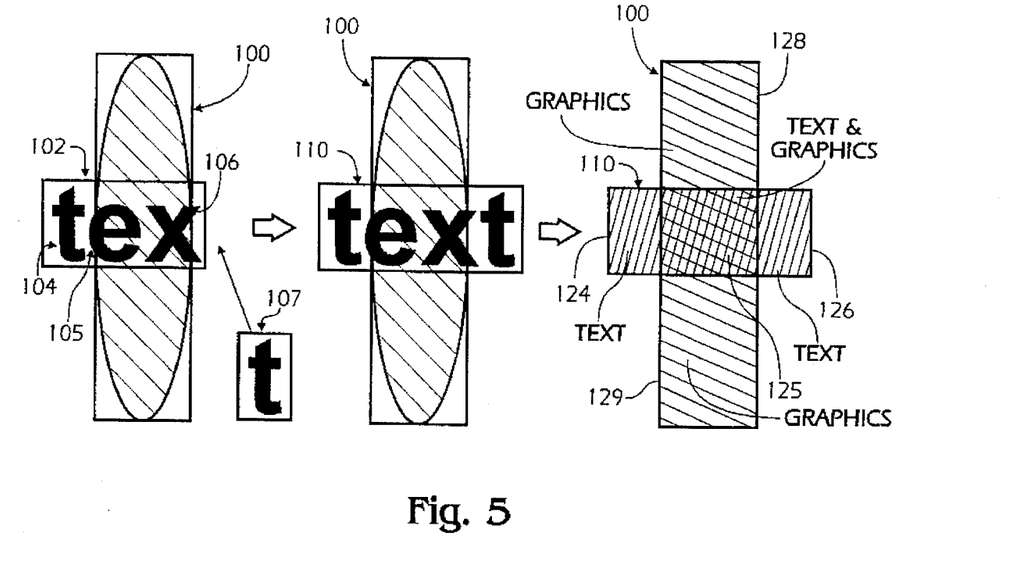
FIG. 5 illustrates visually the development of non-intersecting bounding boxes from bounding boxes of different representation types that overlap according to the method of the diagram of FIG. 4.

FIG. 5 shows visually the development of bounding boxes. Bounding boxes are also referred to herein, in a general sense, as regions. Each bounding box identifies a specific region of a page in which an object, collection of objects, or portions thereof, exists. As was described with reference to page 30 shown in FIG. 2, the selected regions can be set dynamically to correspond to the objects in each page representation. A bounding box is thus a specific example of this concept. However, in the following discussion, the term region refers to the bands as shown in FIG. 2 and not to bounding boxes.

The left-most representation in FIG. 5 illustrates a regional graphics bounding box 100 and a regional text bounding box 102. The text bounding box was formed by combining all the bounding boxes (not shown) for characters 104 (t), 105 (e) and 106 (x). Bounding box 102 is enlarged by adding bounding box 107 associated with the addition of a new character 108 "t" to "tex", resulting in enlarged bounding box 110 shown in the center of FIG. 5 containing the word "text".

Referring again to FIG. 4, this process of building regional bounding boxes of each type continues until the descriptive command is processed for each region, or until intersection with all regions has been determined as described. After the last region is checked, a determination is made at step 112 if there is another command. If there is, the next command is selected at step 114 and process 84 is repeated. If there are no other commands, then intersecting bounding boxes for each region are determined, as shown generally at 116.

In the discussion to follow, it will be seen that different compression algorithms are applied to the different types and combinations of types of representations. The following procedure divides the bounding boxes into non-intersecting bounding boxes that are exclusively of a particular type or a particular combination of types. This allows different objects of different types to have the associated raster representation compressed with different algorithms. During this procedure, the size of bounding boxes that contain a combination of overlapping objects of different types are minimized.

As controlled by iterative loop 118, the regions are sequentially checked to see if the bounding boxes of the different types intersect, as shown in step 120. If not, the next region is checked. If the bounding boxes do intersect, the bounding boxes for the region are divided at step 122 into non-intersecting bounding boxes. This process is illustrated visually in the right illustration of FIG. 5 with shaded boxes representing different non-intersecting bounding boxes. These non-intersecting bounding boxes may also be referred to as subregions. Regional bounding box 110 is divided into non-intersecting bounding boxes 124, 125 and 126. Similarly, regional graphics bounding box 100 is divided into non-intersecting bounding boxes 125, 128, and 129. Non-intersecting text bounding boxes 124 and 126 have only text representations in them. Non-intersecting graphics bounding boxes 128 and 129 have only graphics representations in them. Remaining bounding box 125 has a combination of both text and graphics representations, as noted in the figure.

Figure 6:
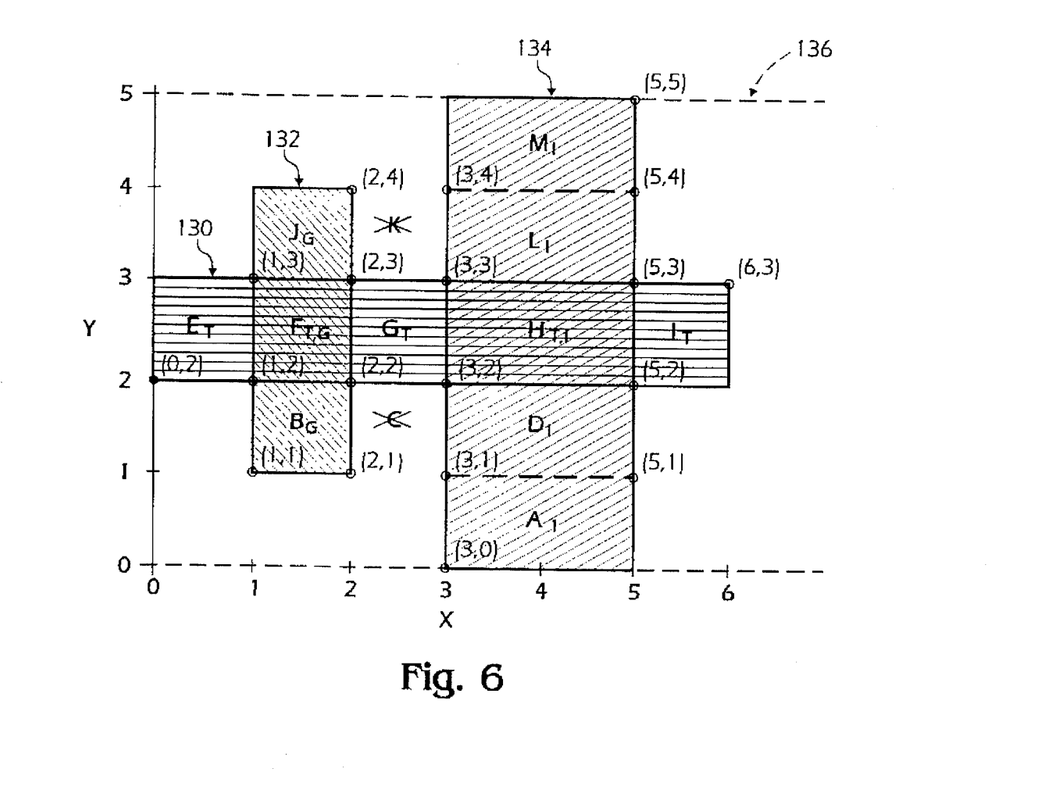
FIG. 6 is a simplified graphic example of overlapping bounding boxes with identifying coordinates used in the method of the diagram of FIG. 4.
Figure 7:
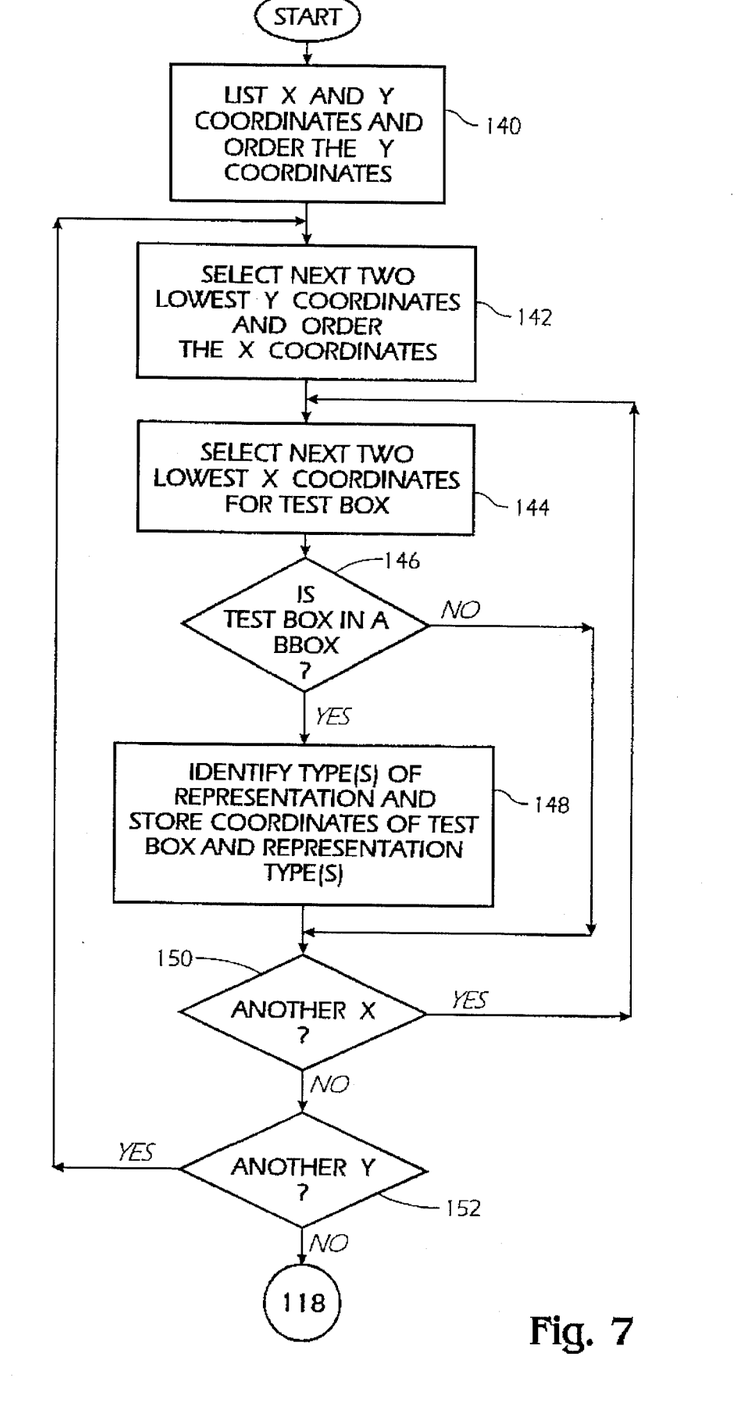
FIG. 7 is a flow diagram illustrating the development of non-intersecting bounding boxes corresponding to step 122 in FIG. 4.

FIG. 6 is a simplified representation of a combination of three different original bounding boxes 130, 132 and 134 in a region 136 of types text (T), graphics (G), and image (I), respectively, as shown. This figure does not represent the same bounding box configuration as FIG. 5, but is used to illustrate the method of dividing intersecting bounding boxes of all three representation types. In order to simplify the explanation, adjacent coordinate values are used and only represent relative pixel coordinates. Actual values are typically much higher and are typically not adjacent. Bounding box 130 is defined by the lower left and upper right coordinates having the (X, Y) values (0,2)(6,3). Similarly, bounding boxes 132 and 134 have the coordinate values (1,1)(2,4) and (3,0)(5,5), respectively. In order to delineate between adjacent bounding boxes, the pixels along the left and bottom boundaries are included in the bounding box and the pixels along the right and top boundaries are excluded. Thus, the upper right coordinate identifying each bounding box is not included in the bounding box.

The process of dividing these regional bounding boxes into non-intersecting bounding boxes may be thought of as a distilling operation. The method is illustrated in the flow diagram of FIG. 7 with reference to the chart of FIG. 6. Starting with step 140, the bounding box coordinates are listed and the Y coordinates are ordered from lowest to highest. This procedure may also be performed in reverse using the highest coordinates first instead of the lowest. In the following discussion, the reference to X and Y coordinates may be reversed and the results will be the same. In this case the Y coordinates are: 0, 1, 2, 3, 4 and 5. The two lowest Y coordinates (0 and 1) are selected initially, and the X coordinates that are associated with the selected Y coordinates are ordered during step 142. Thus, Y=0,1 and X=3,5 as provided by bounding box 134.

X coordinates 1 and 2 for Y=1, which define the bottom boundary of bounding box 132, are not used since this forms the top of what would otherwise be a test box (1,0)(2,1). This top line is not included in the test box, so there is no intersection with bounding box 132.

The next two lowest X coordinates are selected initially, during step 144. In this case there are only two X coordinates. A test is then made during step 146 to determine if the resulting test box is in one of the original bounding boxes. Test box (3,0)(5,1), the top of which is shown by a dotted line in FIG. 6, is in bounding box 134 and is identified as bounding box $A_I$. The subscript I refers to the bounding box type, which in this case is image. This representation type and the coordinates of bounding box A are stored during step 148.

If the test box is not in an original bounding box, it is ignored and step 148 bypassed. The next step 150 is a determination as to whether there are more X coordinates for the existing pair of Y coordinates, 0,1. If so the next two X coordinates would be 5 and whatever the next one is. Since there are no more X coordinates, a test is made at step 152 to determine if there are any more Y coordinates. If not, the distilling procedure is completed. However, in this example, we are just beginning. There being another Y, the procedure returns to step 142 and repeats the above steps for Y=1,2.

Rather than go through the process step-by-step verbally, the following table is used to show the various steps involved in identifying all the non-intersecting bounding boxes A through M.

| Y | X | TEST BOX | ID | STORE? | TYPE |
|---|---|---|---|---|---|
| 0,1,2,3,4,5 | — | — | — | — | — |
|  | 0,1 | — | — | — | — |
|  | 3,5 | — | — | — | — |
|  | 3,5 | (3,0)(5,1) | A | YES | I |
| 1,2 |  |  |  |  |  |
|  | 1,2,3,5 | — | — | — | — |
|  | 1,2 | (1,1)(2,2) | B | YES | G |
|  | 2,3 | (2,1)(3,2) | C | NO | — |

| Y | X | TEST BOX | ID | STORE? | TYPE |
|---|---|---|---|---|---|
|  | 3,5 | (3,1)(5,2) | D | YES | I |
| 2,3 | — | — | — | — | — |
|  | 0,1,2,3,5,6 | — | — | — | — |
|  | 0,1 | (0,2)(1,3) | E | YES | T |
|  | 1,2 | (1,2)(2,3) | F | YES | T,G |
|  | 2,3 | (2,2)(3,3) | G | YES | T |
|  | 3,5 | (3,2)(5,3) | H | YES | T,I |
|  | 5,6 | (5,2)(6,3) | I | YES | T |
| 3,4 | — | — | — | — | — |
|  | 1,2,3,5 | — | — | — | — |
|  | 1,2 | (1,3)(2,4) | J | YES | G |
|  | 2,3 | (2,3)(3,4) | K | NO | — |
|  | 3,5 | (3,3)(5,4) | L | YES | I |
| 4,5 | — | — | — | — | — |
|  | 3,5 | — | — | — | — |
|  | 3,5 | (3,4)(5,5) | M | YES | I |

Figure 10:
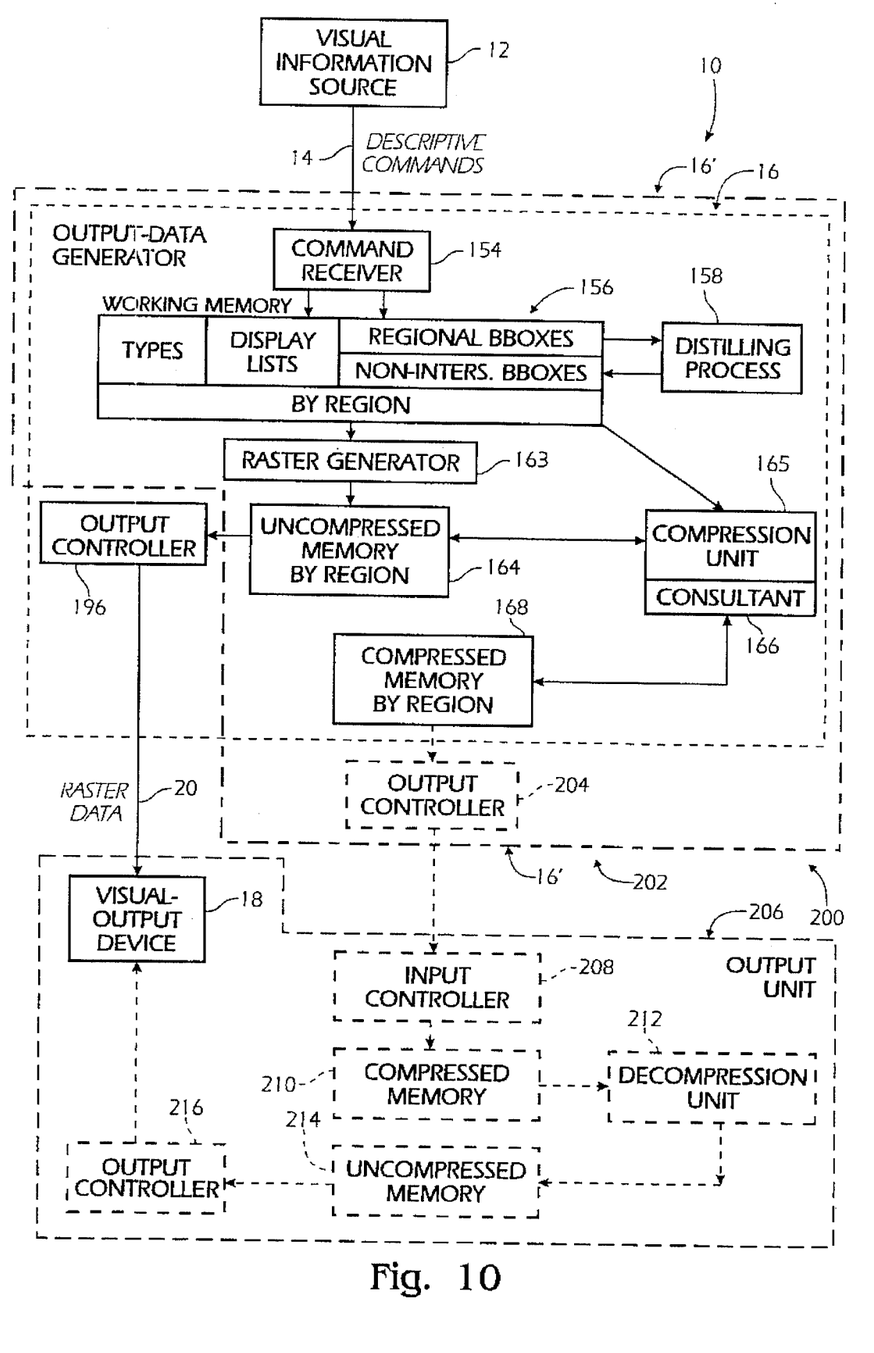
FIG. 10 is a functional block diagram corresponding to the apparatus of FIG. 1.

FIG. 10 is a functional block diagram of the preferred embodiment of system 10 shown in FIG. 1. As shown in FIG. 10 and as has been discussed, a descriptive command receiver 154 assigns display list objects to the incoming commands, divides the display list objects into regions, defines the regional bounding boxes, and stores the resulting information by region in a portion of RAM 26 referred to functionally as a working memory 156. A distilling process unit 158 then divides the regional bounding boxes as required into non-intersecting bounding boxes and stores it in memory 156 as has been described with reference to FIGS. 4–7. The regional bounding boxes are preferably retained in case further processing is required in a region.

After dividing the regional bounding boxes into non-intersecting bounding boxes, the display list is "rasterized" for each region and compressed. Then, the compressed data is stored along with bounding box and representation type information, compression algorithm identifiers, and any compression parameters, as provided by step 78 shown in FIG. 3. This step is shown in further detail in FIG. 8. The compression algorithms are selected, by what is referred to as "consultant" 166 (FIG. 10), on the basis of the previously mentioned compression factors. For instance, high speed operation and high quality may be required. In such a printer, computationally simpler algorithms and lower compression ratio requirements might be used. Alternatively, lower speed, lower quality, and higher compression ratio requirements would allow for more computationally complex algorithms.

Some compression schemes, such as one-color encoding, two-color encoding, run-length encoding, and subsampling, are computationally simple. They provide limited compression of visually active objects, particularly images. However, with simple objects, very high compression is realized. More complex compression schemes, such as those conventionally known as LZW and JPEG, provide varying levels of compression, depending upon the data processed and the values assigned to parameters. The amount of compression is also controlled by controlling the parameters associated with such schemes, as is well known in the art. In some cases, then, it may be possible to obtain poor visual quality quickly or high quality slowly. The particular compression algorithms used are determined by the compression factors.

Combinations of these techniques can be used to achieve even different levels of compression, computational complexity and visual quality. The characteristics of the contents of the bounding boxes may be identified to determine whether yet other techniques would be appropriate. If a given bounding box has, for example, a graphic representation, then perusal of it may show that it consists of only two different colors. For a continuous tone device, a savings of 8-to-1 for each colorant is achieved by representing the pixel map of the bounding box with a one-bit-per-pixel map without sacrificing quality. If the contents have a single color, it is sufficient to store only the color and bounding box information. The compression realized depends upon the size of the bounding box.

As another example, the local activity or rate of change in the content of a bounding box could be determined. If there is only slight activity, a runlength coder technique may be used. If it is highly active, the JPEG technique may be employed. Further, if a representation is only a small portion of a region, then the raster contents of the bounding boxes may be simply copied. This provides RAM savings by not saving a raster representation of the unmarked background. This is also desirable for some bounding boxes that contain combinations of objects or representation types. Thus, copying the raster data associated with a bounding box may be an important compression algorithm for satisfying compression goals.

Figure 8:
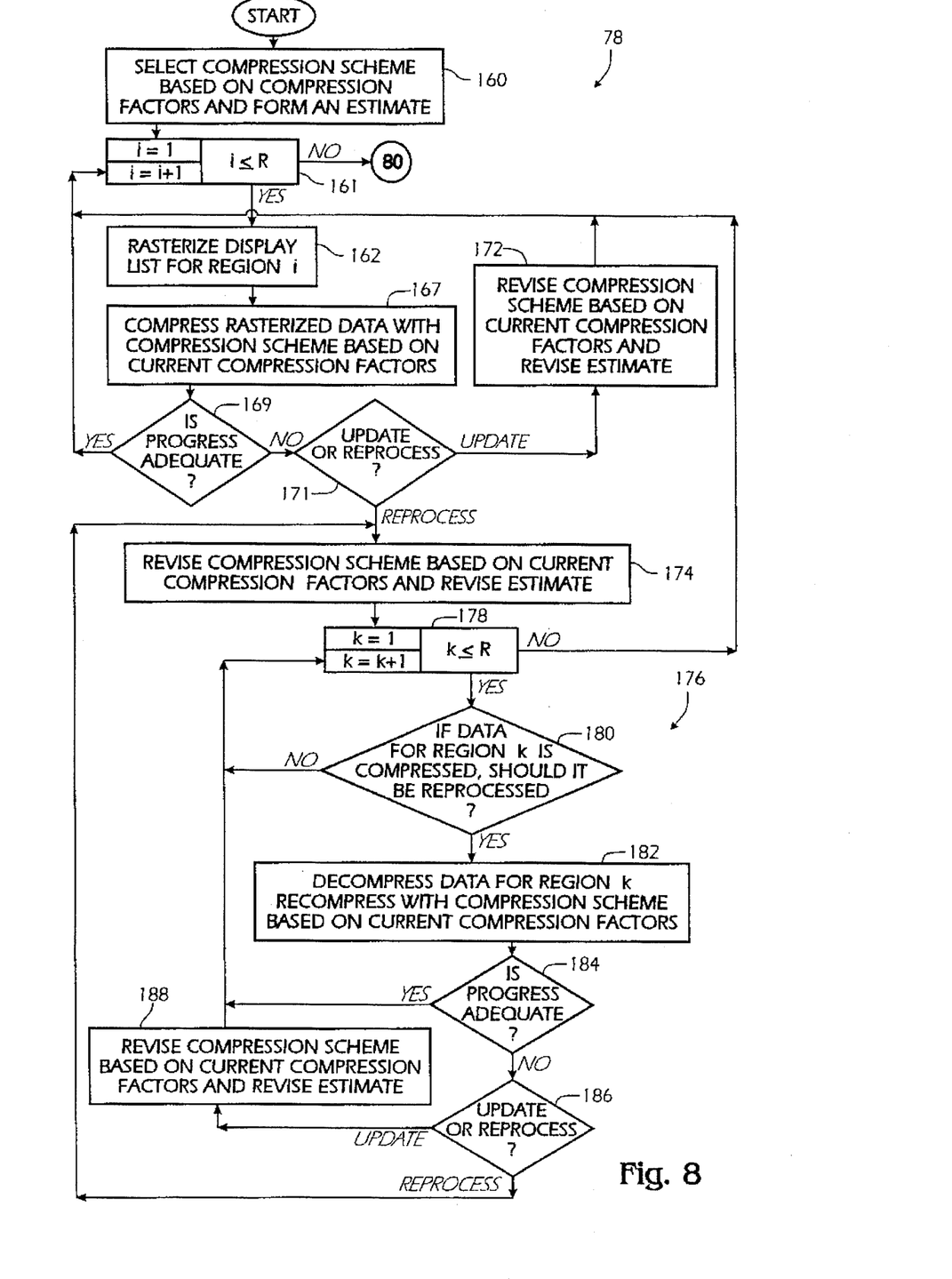
FIG. 8 is a flow diagram of step 78 of the diagram of FIG. 3.

The initial selection by consultant 166 of a set of compression algorithms (a compression scheme) including at least one algorithm, for compressing the data is shown as step 160 in FIG. 8. An "algorithm" as used herein refers to an algorithm with specific parameter values. Thus, a change in parameter values results in a different algorithm and different parameter values result in a plurality of algorithms. Each time a compression scheme is selected, consultant 166 may form an estimate of the amount of overall compression expected based upon the various compression algorithms selected and the content of the page representation. Alternatively, the algorithms may be selected based upon an estimated compression requirement.

An iterative loop defined by step 161 is used to progress serially through the regions. For each region, the display list is rasterized in step 162 by a raster generator 163 and stored uncompressed in an "uncompressed" memory 164 (FIG. 10), as provided by step 162. A compression unit 165, using algorithms selected for the compression scheme, subject to modification by a "consultant" 166, shown in FIG. 10, based upon the current state of the relevant compression factors, compresses, at step 167, the rasterized display list and stores it in a "compressed" memory 168 (FIG. 10). RAM 26 of FIG. 1 includes functional memories 156, 164 and 168. Different compression algorithms may be used on data corresponding to different bounding boxes determined according to the relevant compression factors. The bounding box, representation type, algorithm identifiers, and parameter values used are stored with the compressed data.

The current values of the compression factors are compared to the target values to determine if adjustments may be required at decision step 169. If progress is adequate, data for the next region is obtained.

If consultant 166 determines in step 169 that progress toward achieving the target compression factors is inadequate, the extent of inadequacy relative to the proportion of the page representation compressed is used to determine at step 171 whether to simply update the compression scheme and continue, or whether to reprocess at least some of the data that is already compressed. If the decision is to update, then in step 172 the compression scheme is revised based upon the current state of the relevant compression factors. A revised estimate of the expected compression results based on actual and projected progress is also determined. A new region is then selected at step 161 and the process continues as has been described.

If at step 171 a decision is made to reprocess the existing data, then a revised compression scheme and an updated estimate of expected compression are determined at step 174, based upon the relevant compression factors for this situation. A loop process, shown generally at 176, is then followed to reprocess the previously compressed data. An iteration control step 178 is used to progress through all of the regions. A determination is made in step 180 as to whether data for the particular region is compressed, and if so, whether it is desirable to reprocess the corresponding data. For instance, if very little additional memory capacity is needed, it may be sufficient to reprocess only the data for the last region that was compressed, or only reprocess the data for regions having large amounts of data. If it is not to be reprocessed, the next region is selected. If it is to be reprocessed, the data for the region is decompressed at step 182 based on the algorithms used to compress it. Then an algorithm identified in the new compression scheme, possibly modified based upon the current state of the compression factors, is used to recompress the data.

The recompressed data is again stored in compressed memory 168. Progress is checked at step 184. If progress is determined to be adequate, the data for the next region is processed. If progress is inadequate, then a decision is made at step 186 either to simply update the compression scheme and continue processing data for the remaining regions, or to reprocess selectively the data for all of the regions. As with the procedure associated with step 171, if the decision is to update, then the compression scheme is updated and estimates revised at step 188, and processing is continued at iterative step 178. If the decision is made to reprocess the data for a given region, then step 174 is returned to and reprocessing method 176 is reinitiated.

Reprocessing method 176 is followed until all of the previously compressed data is reprocessed. Control then returns to iterative step 161 to process data for any additional regions. Compression process 78 continues until there is sufficient compression to store all of the data. There is preferably at least one compression scheme that guarantees that all of the data will be compressed enough to be stored in memory. By definition, during this process, only data associated with those areas of a page on which "marking" occurs is stored. Data associated with portions of a region where no marking occurs is not stored. This provides an inherent compression, regardless of the use of specific compression algorithms on the stored data.

It is also possible for RAM 26 of FIG. 1 to run out of memory when generating the display lists during process 84 shown in FIG. 4. In such a case, the existing display lists are rasterized, compressed and stored following a procedure very similar to that described with reference to FIG. 8 until adequate progress is achieved. Then display list generation is resumed for the unprocessed descriptive commands.

Figure 9:
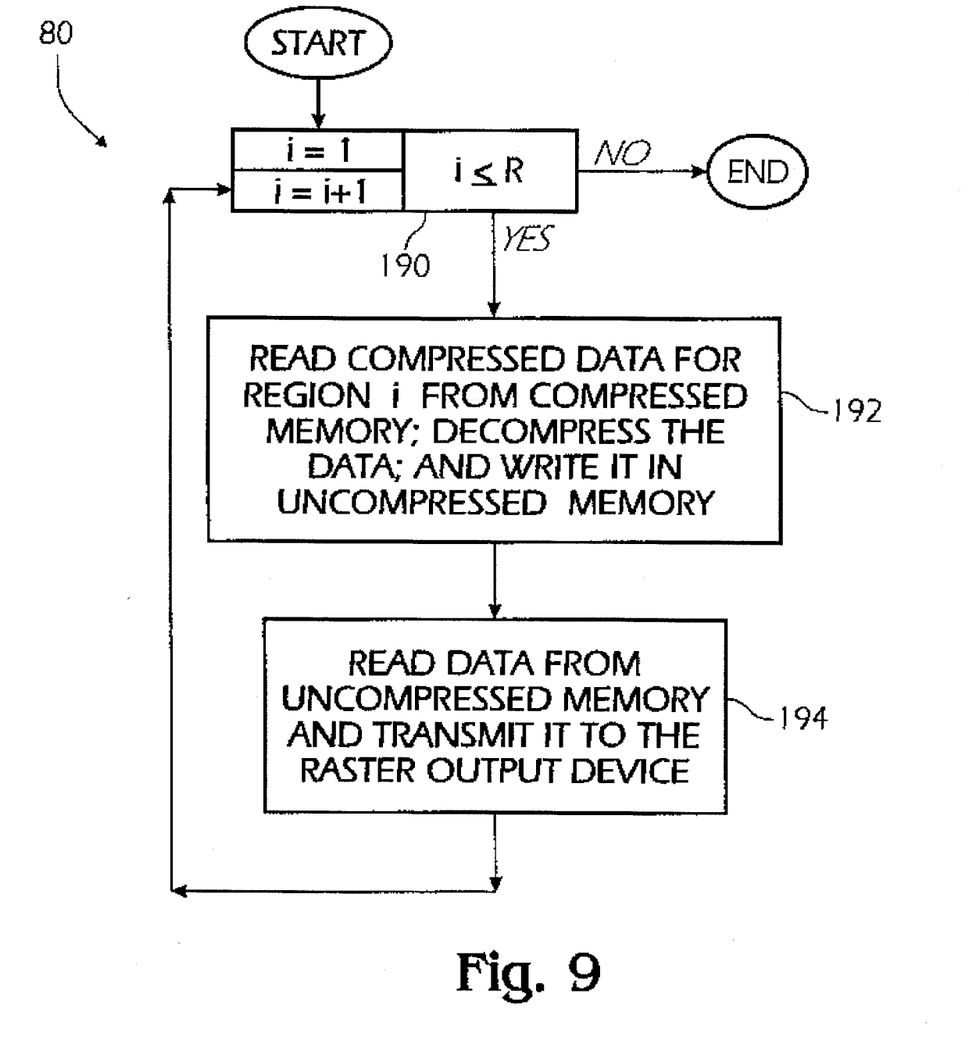
FIG. 9 is a flow diagram of step 80 of the diagram of FIG. 3.

The outputting of data to the visual output device, shown generally as step 80 in FIG. 3, is shown in further detail in FIG. 9. Because the regions into which the page is divided correspond to the raster order for producing the visual output, the regions are sequentially output. This is represented by the iterative loop 190 shown in FIG. 9. For each region, the data stored in compressed memory 168 is read, decompressed based upon the algorithm(s) used to compress it, and stored in uncompressed memory 164, as represented by step 192. The data is decompressed using the reverse of the compression algorithm used to compress it, or a variation of it, depending upon existing conditions. For instance, in order to make raster data available to the print device, it may be necessary to modify the algorithm(s) to increase the speed at which the data is decompressed. At step 194 the raster data is read from memory 164 and output on communication link 20 to the visual-output device 18 under the control of an output controller 196. As has been mentioned, in the preferred embodiment, the output device prints the page representation on a hard copy page. It is possible to bypass the compress/decompress cycle if the last region processed is the first region required by the print device.

FIG. 10 also illustrates an alternative printer system 200 made according to the invention. System 200 includes a host unit 202, such as a workstation, including source 12 and a modified output-data generator 16'. Generator 16' includes the components of generator 16, except output controller 196, and output controller 204 that transmits data from compressed memory 168 to an output unit 206. The modified content of generator 16' is represented by the dash-dot lines excluding controller 196 and including controller 204.

Output unit 206 includes an input controller 208 that receives the regional compressed and associated data from generator 16', and stores it in a compressed memory 210 similar to memory 168 in generator 16'. A decompression unit 212, providing the decompression function described for compression unit 165 of generator 16, when required for output, decompresses the data and forms the necessary raster data in an uncompressed memory 214. An output controller 216, equivalent to controller 196 then transmits the raster data to a resident visual-output device 18.

In system 200, then, steps 56, 58 and 78 shown in FIG. 3 are provided by host unit 202, and step 80 is provided by output unit 206. Considering the variations in hardware that are thus possible, the respective components, such as of host unit 202 and output unit 206, are referred to jointly as "computer means", "memory means", "processor means" and the like.

In the preferred embodiment, RAM 26 of FIG. 1 is used as the working memory, the uncompressed memory, and the compressed memory. A working memory also exists in conventional PostScript-based printers. The uncompressed memory stores data for a single region at a time. If a page is divided into forty regions, this is a small part of the total memory requirements. The primary benefit of this invention is realized in reducing the size requirements of what is referred to as compressed memory 168. The size is directly proportional to the amount of compression desired relative to visual quality, and computational complexity. For instance, if a minimum compression of 10:1 is desired, the memory size is reduced accordingly. However, if a consistently higher quality visual output is desired, a 4:1 compression may be selected. The target compression then affects the balance between the compression goals of compression ratio, visual quality, and computational complexity.

It will be understood that parallel processing of regional data can also be used for distilling bounding boxes, compressing, storing, reading and printing. As has been mentioned this allows for processing different parts of the data for a page at a time. This can be extended to also process data for different pages at the same time.

The division of a page into parallel regions or bands is not a requisite to the general aspects of the present invention. The method of the present invention can also be carried out in a non-band environment, such as the system sold by Adobe Systems Incorporated with the name Photoshop. As noted though, it is useful in the specific embodiment as part of a printer to operate in a banded environment. There are additional inherent benefits in this type of system. That is, one wants to minimize the number of times, during data processing and printing, that data has to be compressed and decompressed in order to generate the raster data required by the output device. The use of bands and associated display lists assures that the data required by the printer is available in the sequence needed.

As has been noted with regard to various features of the present invention, it will be apparent to one skilled in the art that variations in form and detail may be made in the preferred embodiment and method without varying from the spirit and scope of the invention as defined in the claims or as interpreted under the doctrine of equivalents. The preferred embodiment and method are thus provided for purposes of explanation and illustration, but not limitation.

I claim:

1. A method of generating data for producing a page representation on a page by a visual-output device, comprising the steps of:

receiving data defining the page representation;

defining a first compression factor to have a determinable value;

providing a first compression algorithm associated with a first value of the first compression factor and a second compression algorithm associated with a second value of the first compression factor;

dividing at least a portion of the page into a plurality of regions containing collectively at least a portion of the page representation;

for each region,
identifying separate data corresponding to the portion of the page representation contained in that region;
determining the value of the at least one compression factor;
selecting at least a first of the compression algorithms if the at least one compression factor has a value that has a predetermined relationship to a first value;
compressing identified data for the at least one region with the selected algorithm; and
storing the compressed data; and after storing the compressed data, decompressing the stored data, and transmitting the decompressed data to the visual-output device.

2. A method according to claim 1 wherein at least one of the compression factors is a target compression ratio.

3. A method according to claim 1 wherein at least one of the compression factors is a target visual quality of the page representation.

4. A method according to claim 1 wherein at least one of the compression factors is a target computational complexity.

5. A method according to claim 1 wherein the page representation includes at least two representation types, and the method further comprises the step of determining at least one type of representation for the portion of the page representation defined by the data associated with the at least one region, and wherein at least one of the compression factors is the type of representation, and the step of selecting includes selecting at least the first compression algorithm if the determined representation type is a first type.

6. A method according to claim 1 wherein the portion of the page representation for at least the one region has one of two identifiable characteristics and at least one of the compression factors is the characteristic of the portion of the page representation in a region, and the method further comprises the step of determining the characteristic of the portion of the page representation for at least the one region, and the step of selecting includes selecting at least the first compression algorithm if the determined characteristic is the one characteristic.

7. A method according to claim 1 wherein the page representation includes a plurality of object representations and at least one of the compression factors is the proportion that an object representation occupies relative to the page representation, and the method further comprises the step of determining the proportion that an object representation occupies relative to the page representation, and the step of selecting includes selecting at least the first compression algorithm if the proportion that an object representation that forms at least a portion of the page representation in the one region, has a value that has a predetermined relationship to a first value.

8. A method according to claim 1 wherein the step of providing the at least one compression factor includes providing a plurality of compression factors; and the step of selecting includes selecting at least the first compression algorithm if the at least one of the compression factors has a value that has a predetermined relationship to a first value.

9. A method according to claim 8 further comprising the step of prioritizing at least two of the compression factors, and wherein the step of selecting includes selecting a compression algorithm based upon the relative priority of the at least two of the compression factors.

10. A method according to claim 1 wherein the at least one compression factor has a target value and the actual value is determinable based on the step of compressing, the method including, after the step of compressing identified data for the at least one region, determining the actual value of the at least one compression factor, and if the actual value has a predetermined relationship to the target value, decompressing the compressed data for the at least one region, selecting at least one compression algorithm based on the relationship of the actual value to the target value, and recompressing the previously compressed data using the selected at least one compression algorithm.

11. A method according to claim 1 wherein the at least one compression factor has a target value and the actual value is determinable based on the step of compressing, the method including, after the step of compressing identified data for the at least one region, determining the actual value of the at least one compression factor, and if the actual value has a predetermined relationship to the target value, selecting at least a second compression algorithm different than the at least a first compression algorithm, based on the relationship of the actual value to the target value, and compressing at least a portion of the data identified for at least a second region with the at least a second compression algorithm.

* * * * *